United States Patent [19]

Chinn et al.

[11] Patent Number: 5,223,443
[45] Date of Patent: Jun. 29, 1993

[54] METHOD FOR DETERMINING WAFER CLEANLINESS

[75] Inventors: Jeffrey D. Chinn, Foster City; Ciaran P. Hanrahan, Fremont, both of Calif.

[73] Assignee: Integrated Device Technology, Inc., Santa Clara, Calif.

[21] Appl. No.: 838,539

[22] Filed: Feb. 19, 1992

[51] Int. Cl.$^5$ .......................................... H01L 21/302
[52] U.S. Cl. ........................................ 437/8; 437/228; 437/229; 437/946; 134/2; 134/3; 156/626; 156/644
[58] Field of Search ................... 437/8, 228, 229, 946; 134/2, 3; 156/626, 644

[56] References Cited

U.S. PATENT DOCUMENTS

| | | | |
|---|---|---|---|
| 4,473,795 | 9/1984 | Wood | 437/8 |
| 4,514,436 | 4/1985 | Moerschel | 437/228 |
| 4,599,241 | 7/1986 | Nakaboh et al. | 437/8 |

FOREIGN PATENT DOCUMENTS

| | | | |
|---|---|---|---|
| 63-307760 | 12/1988 | Japan | 437/228 |
| 2-254774 | 10/1990 | Japan | 437/228 |

Primary Examiner—Olik Chaudhuri
Assistant Examiner—Ourmazd S. Ojan
Attorney, Agent, or Firm—Thomas E. Schatzel

[57] ABSTRACT

An embodiment of the present invention is a method for determining the cleanliness of a semiconductor wafer initially deposited with polysilicon, patterned with photoresist, processed, and then having the resist removed under standard conditions. The method comprising the steps of: depositing a thin TEOS film over the entire surface of a wafer; exposing said wafer to a solution of hot potassium hydroxide (KOH) that attacks polysilicon and is highly selective to and does not etch said TEOS film, the exposing such that if any pin hole exists in the TEOS film an underlying layer of polysilicon is attacked vigorously; and inspecting said wafer for a visual indication in said polysilicon layer of whether or not said polysilicon layer was attacked by the exposure to said potassium hydroxide (KOH).

7 Claims, 1 Drawing Sheet

METHOD FOR DETERMINING WAFER CLEANLINESS

BACKGROUND OF THE INVENTION

1. Field of the Invention

The invention relates generally to semiconductor processing and more particularly to methods of detecting photoresist residues.

2. Description of the Prior Art

In the fabrication of semiconductor devices and structures, photosensitive organic films, commonly referred to as "photoresists," are used in selective doping by ion implantation and in selectively transferring patterns to films. In subsequent process steps, photoresists are commonly subjected to very harsh environments, such as strong acids, high temperatures, ultraviolet radiation, and high energy reactive ions and radicals. A common problem is in how to remove these highly altered photoresist films as completely as is necessary. Since photoresist films are mostly organic polymers, oxidizing agents are commonly used. The photoresist is usually exposed to an oxygen plasma which reduces carbon based polymers to water ($H_2O$) and any of several carbon-oxygen molecules ($CO_x$). Other methods of removing resist include exposing the resist to a strong oxidizing acid, such as concentrated sulfuric acid ($H_2SO_4$), hydrochloric acid (HCl), and others. But since the photoresist is often subjected to processes which alter the organic foundations of the polymer, the complete removal of the photoresist can be very difficult because the material has changed its properties. For example, exposing a photoresist film to a beam of arsenic ions results in the implantation of atomic arsenic into the photoresist film. Resist removal processes that oxidize the resist will subsequently leave an arsenic oxide on the surface.

Incompletely stripped photoresist material is called "residue," and is usually undesirable. Residues can later cause an incomplete etch. Removing residue is essential in any thin film and/or device manufacturing process. The size of the resist residues can vary from large enough to be seen with the naked eye, down to the atomic level. Sub-micrometer residues require very complex analytically tools such as scanning electron microscopy (SEM) to be detected, and even these may or may not help an inspector to see all the residues that are large enough to be a source of problems in later steps.

SUMMARY OF THE PRESENT INVENTION

It is therefore an object of the present invention to provide a reliable way to determine whether or not a semiconductor wafer has been cleaned properly.

Briefly, an embodiment of the present invention is a method for determining the cleanliness of a semiconductor wafer after it has been initially deposited with polysilicon, patterned with photoresist, processed, and then had the resist removed under standard conditions. The method comprises the steps of depositing a thin tetraethyl-orthosilicate (TEOS) film over the entire surface of a wafer and then exposing the wafer to a solution of hot potassium hydroxide (KOH). The KOH will attack any exposed polysilicon and is highly selective to and will not etch the TEOS film. The exposing to KOH such that if any pin hole exists in the TEOS film, an underlying layer of polysilicon will be vigorously attacked. Inspecting the wafer is simplified, because highly visible indications will be present in the polysilicon layer that clearly indicate whether or not there had been any residues. An unaffected polysilicon layer indicates that there were no residues.

An advantage of the present invention is that a method of wafer inspection is provided in which a visual indication is produced that can be easily recognized.

Another advantage of the present invention is a method of wafer inspection is provided in which the use of high expensive tools, such as a scanning electron microscope, are not required for comprehensive inspections of residue.

Another advantage of the present invention is that a method of wafer inspection is provided which is inexpensive and can be performed quickly with accurate results.

Another advantage of the present invention is that a method of wafer inspection is provided that is extremely sensitive to surface residues. While a film of 250 Å of TEOS is used to block the wet etchant (KOH), residuals smaller than the thickness of the film can also be detected since all the residue does is to disrupt the contiguous nature of the conformal film. Residues not detected by SEM have been detected by this method.

These and other objects and advantages of the present invention will no doubt become obvious to those of ordinary skill in the art after having read the following detailed description of the preferred embodiments which are illustrated in the various drawing figures.

IN THE DRAWINGS

DETAILED DESCRIPTION OF THE PREFERRED EMBODIMENTS

An embodiment of the present invention is a method for determining and characterizing the surface cleanliness of a semiconductor wafer. The method is based on depositing a film of tetraethyl-orthosilicate (TEOS), which is a glass commonly used as a dielectric layer between poly-one and poly-two layers, and between metal-one and metal-two layers. A very thin TEOS film that easily conforms to small features is deposited on a wafer surface that is suspected of containing residues. If the surface is actually free of all residues, the TEOS deposit will form a contiguous film free of any pinholes. However, if a residue is present, the TEOS film will be punctuated by such residue. Subsequent to depositing the TEOS film, the wafer surface is exposed to an etchant that is extremely selective and will therefore not attack TEOS. Any pinholes caused by residues in the TEOS film will open the polysilicon to attack by the etchant.

Figure 1:
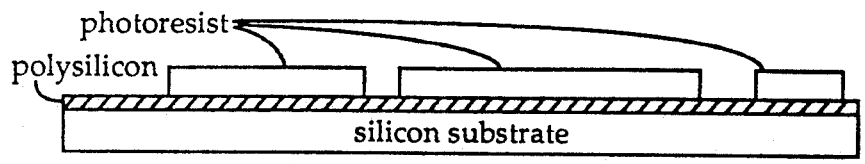
FIG. 1 is a cross section of a wafer having a photoresist on a polysilicon layer and a silicon substrate.
Figure 2:
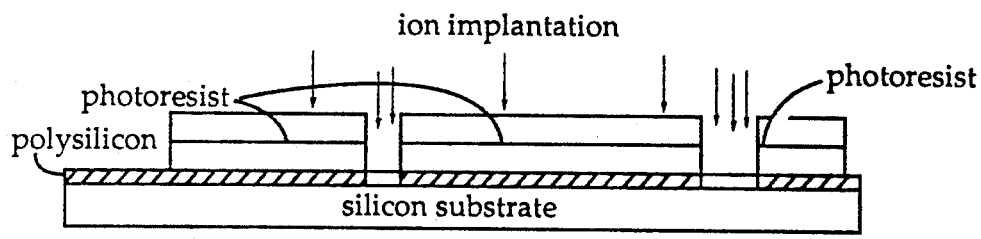
FIG. 2 shows the wafer of FIG. 1 during an ion implantation that alters some of the photoresist.
Figure 3:
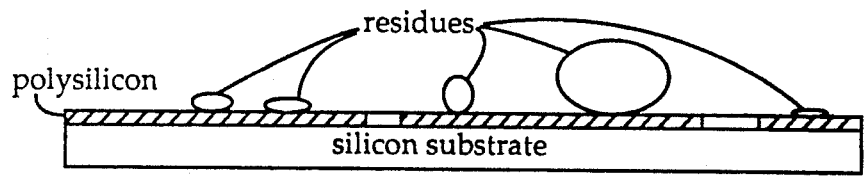
FIG. 3 shows invisible residues that are left on a wafer after cleaning.

FIG. 1 illustrates a semiconductor wafer which is initially deposited with polysilicon and then patterned with a photoresist. The wafer is then further processed, as illustrated in FIG. 2, by an ion implantation step. An ion bombardment alters the photoresist and makes it harder to remove completely. The bulk of the photoresist is removed, leaving a residue, as in FIG. 3. For purposes of illustration only here, the wafer is shown being implanted, in FIG. 2.

Figure 4:
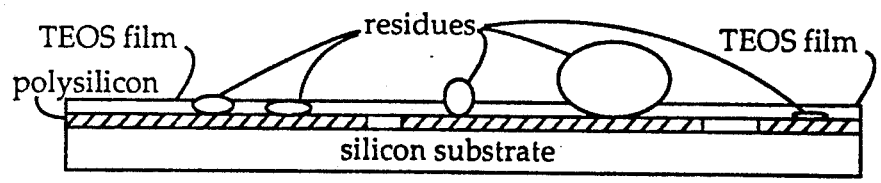
FIG. 4 is a cross section showing the wafer of FIG. 3 after having had a thin TEOS film deposited over the whole surface.

In FIG. 4, a thin TEOS film is then deposited 250 Å to 500 Å over the entire surface. The film can be deposited in any number of common ways, such as with a chemical vapor deposition (CVD) furnace, plasma enhanced deposit, etc. Good results have been obtained by the inventors when using commercially available NOVELLUS brand equipment. Films with properties similar to TEOS can also be used.

Figure 5:
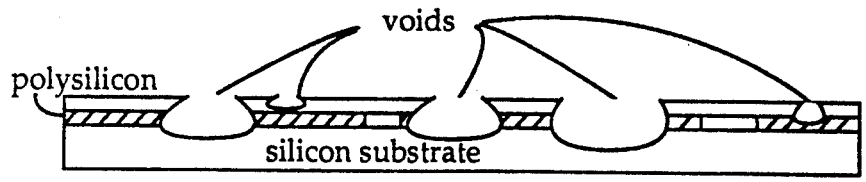
FIG. 5 is a cross section of the wafer of FIG. 4 after having been exposed to a strong agent. Note several large holes have appeared in the polysilicon layer where residues prevented the TEOS layer from protecting the polysilicon.

The entire substrate is exposed to a solution of hot potassium hydroxide (KOH). The hot KOH solution readily attacks polysilicon while also being highly selective to the TEOS film. If any pin hole exists in the TEOS film as a result of a residue being present, the underlying layer of polysilicon will be attacked vigorously. This produces a visual indication in the polysilicon layer if unacceptable residues had been present, as represented in FIG. 5. The present method is very sensitive. Residues invisible to optical microscopy and not detectable by scanning electron microscopy have tested "positive" by the present method, indicating residues, in fact were present.

Other protective film and etching agent combinations can also be used in conformance with the present invention. Other kinds of residues may also be detected besides those that are left behind by an incompletely stripped photoresist. For example, some polysilicon etch steps in a fabrication process that use hydrogen bromide can leave a "fence-post" polymer on the edges of a structure. The above method of covering with TEOS and exposing to KOH can reveal whether the standard or other cleaning procedures used by a fab are effective. Starting wafers can also be inspected for cleanliness, as they are received from a supplier, with the TEOS film and KOH combination, as described above.

TEOS and KOH are readily available in most wafer fabs, and for this reason the combination of them are preferred. Thin films of polysilicon also exhibit a high degree of being able to conform to surfaces such as found with TEOS. If a thin film of polysilicon is deposited over an underlying layer of silicon dioxide, an HF vapor can be used to check for residues on the surface of the silicon dioxide, because the HF vapor will selectively attack oxide, but not the polysilicon.

Although the above method is, in a sense, a destructive test. It only destroys parts of wafers that had unacceptable photoresist residues. Areas of the wafer that have been properly stripped of all residue will be unaffected by the exposure to the KOH solution.

Experiments

An experiment was performed which verified that a poly-two implant residue after stripping does, in fact, result in a material which is known to be the cause of many device failures.

Blank poly wafers were exposed, fusion baked and implanted with the poly-two implant ($^{75}As^+$, 5E15, 80 KeV) followed by a standard resist strip of 965 asher and sulfuric clean. Wafers were observed to be visually clean, but under a scanning electron microscope, a residue could be seen. A thin, 500 Å TEOS dielectric was then deposited and samples were exposed to KOH. Regions where the implant residue had been observed showed the polysilicon had been attacked, after fifteen seconds in KOH. Regions where no residue had been seen showed no attack of the polysilicon, even after a five minute exposure in KOH.

Various post resist strips had been performed in the experiment, as follows:

| | |
|---|---|
| 1) 100:1 HF | five seconds |
| 2) 100:1 HF | twenty-five seconds |
| 3) 100:1 HF | forty seconds |
| 4) 100:1 HF | twenty-five seconds + RCA clean |
| 5) RCA Clean | |
| 6) No post strip clean | (as a control) |

A thin 500 Å TEOS dielectric was then deposited and samples were exposed to KOH. The number of "highlights" were counted under a microscope (in one field-of-view at 500×).

| | Results: | |
|---|---|---|
| | HIGHLIGHTS | |
| POST RESIST STRIP | one minute | three minutes |
| Type 1) | 0 | 1 |
| Type 2) | 0 | 4 |
| Type 3) | 1 | 0 |
| Type 4) | 1 | 5 |
| Type 5) | 0 | 11 |
| Type 6) | 15 | |

Tests showed that a 100:1 HF forty second dip is superior in removing implant residue.

Although the present invention has been described in terms of the presently preferred embodiments, it is to be understood that the disclosure is not to be interpreted as limiting. Various alterations and modifications will no doubt become apparent to those skilled in the art after having read the above disclosure. Accordingly, it is intended that the appended claims be interpreted as covering all alterations and modifications as fall within the true spirit and scope of the invention.

What is claimed is:

1. A method for determining the cleanliness of a semiconductor wafer, the method comprising the steps of:
   depositing a thin conformal film over an entire surface of a wafer comprising an underlying polysilicon layer;
   exposing said wafer to an agent that selectively attacks polysilicon material and that does not substantially etch said conformal film wherein any aberrations of said conformal film that exist on said underlying polysilicon layer open said underlying polysilicon layer to attack by said selective agent; and
   inspecting said wafer for a visual indication in said polysilicon layer of whether said polysilicon layer had been attacked by such exposure to said agent.

2. The method of claim 1, wherein:
   the depositing comprises using a conformal film of tetraethyl-orthosilicate (TEOS).

3. The method of claim 1, wherein:
   the exposing of said wafer comprises using an agent having potassium hydroxide (KOH).

4. The method of claim 1, wherein:

the exposing step comprises exposing said wafer in which a photoresist residue causes said aberration of said conformal film.

5. A method for determining the cleanliness of a semiconductor wafer initially deposited with polysilicon, patterned with photoresist, processed, and then having had the resist removed, the method comprising the steps of:

depositing a thin TEOS film over the entire surface of a wafer;

exposing said wafer to a solution of hot potassium hydroxide (KOH) that attacks polysilicon and is highly selective to and does not etch said TEOS film, the exposing such that if any pin hole exists in the TEOS film an underlying layer of polysilicon is attacked vigorously; and inspecting said wafer for a visual indication in said polysilicon layer of whether or not said polysilicon layer was attacked by the exposure to said potassium hydroxide (KOH).

6. A method for visually enhancing evidence of residues on a semiconductor wafer, the method comprising the steps of:

covering a semiconductor wafer with a conformal film comprising polysilicon that is resistant to an etching agent comprising HF vapor that will attack the material of an underlying layer comprising silicon dioxide; and immersing said semiconductor wafer in said etching agent for a period of time sufficient for visibly large voids to be formed in said underlying layer if any etching agent was able to breach said conformal film as a consequence of said semiconductor wafer having residues on its surface.

7. A method for visually enhancing evidence of residues on a semiconductor wafer, the method comprising the steps of:

covering a semiconductor wafer with a conformal film comprising tetraethyl-orthosilicate (TEOS) that is resistant to an etching agent which comprises potassium hydroxide (KOH) that will attack the material of an underlying layer comprising silicon; and immersing said semiconductor wafer in said etching agent for a period of time sufficient for visibly large voids to be formed in said underlying layer if any etching agent was able to breach said conformal film as a consequence of said semiconductor wafer having residues on its surface.

* * * * *